(12) United States Patent
Stiebig et al.

(10) Patent No.: US 6,310,382 B1
(45) Date of Patent: Oct. 30, 2001

(54) MULTICOLOR SENSOR

(75) Inventors: Helmut Stiebig, Jülich; Dietmar Knipp, Hennef; Joachim Fölsch, Alzenau; Heribert Wagner, Jülich, all of (DE)

(73) Assignee: Forschungszentrum Julich GmbH, Julich (DE)

( * ) Notice: Subject to any disclaimer, the term of this patent is extended or adjusted under 35 U.S.C. 154(b) by 0 days.

(21) Appl. No.: 09/486,567
(22) PCT Filed: Aug. 28, 1998
(86) PCT No.: PCT/DE98/02598
§ 371 Date: Feb. 25, 2000
§ 102(e) Date: Feb. 25, 2000
(87) PCT Pub. No.: WO99/12206
PCT Pub. Date: Mar. 11, 1999

(30) Foreign Application Priority Data

Aug. 28, 1997 (DE) ............................................. 197 37 561

(51) Int. Cl.⁷ ........................... H01L 31/00; H01L 27/148
(52) U.S. Cl. ......................................... 257/440; 257/225
(58) Field of Search ..................................... 257/440, 225

(56) References Cited

U.S. PATENT DOCUMENTS

| | | |
|---|---|---|
| 4,820,915 * | 4/1989 | Hamakawa et al. . |
| 4,875,944 | 10/1989 | Yoshida . |
| 5,298,771 * | 3/1994 | Mantell . |
| 5,311,047 | 5/1994 | Chang . |
| 5,352,920 * | 10/1994 | Morishita et al. . |
| 5,738,731 * | 4/1998 | Shindo et al. . |

FOREIGN PATENT DOCUMENTS

WO 96/13865   5/1996   (WO) .

OTHER PUBLICATIONS

"Stacked a–SiC:H/a–Si:H heterostructures . . .", by Topic et al., Journal of Non–Crystalline Solids 198–200 (1996).
"Variable spectral response photodetector . . ." by De Cesare et al., Journal of Non–Crystalline Solids 198–200 (1996).

\* cited by examiner

Primary Examiner—Stephen D. Meier
(74) Attorney, Agent, or Firm—Herbert Dubno

(57) ABSTRACT

The invention relates to a multicolor sensor with a plurality of diode functions comprising a succession of layers with p and n doped layers. Conductive transparent contact layers are thereby fitted. According to the invention, pin, nip, npin and/or pnip structures can be provided.

6 Claims, 5 Drawing Sheets

MULTICOLOR SENSOR

CROSS REFERENCE TO RELATED APPLICATIONS

This application is a national stage of PCT/DE98/02598 from Aug. 28, 1998 and is based upon German national application 197 37 561.8 filed Aug. 28, 1997 under the International Convention.

FIELD OF THE INVENTION

The present invention relates to a multicolor sensor and to optoelectronic components.

BACKGROUND OF THE INVENTION

Two-terminal components are known as state of the art. These optoelectronic components contain two contacts (terminals) with a p-n-semiconductor structure lying therebetween to produce a photo current upon light incidence. It is a drawback that the voltage must be switched so that a red-green-blue (RGB) signal can be enabled sequentially from a time point of view.

An nipin-layer structure with a photosensitive electrical component between two outer contacts and based upon amorphous silicon is already known from U.S. Pat. No. 5,311,047. A piiin structure has also been proposed as a photosensitive electrical component with two outer contacts on the basis of amorphous silicon.

In addition, three-terminal components are known as state of the art. A first proposal for constructing pin/TCO [transparent conductive oxide]/nipin structure as a three-terminal component has already been published in M. Topic, F. Smole, J. Furlan, W. Kusian, J. of Non-Cryst. Solids 198–299 (1996) 1180–1184. Here as well the drawback of sequential switching of the voltage applies.

Finally, so-called charge-coupled devices (CCD) are known in which, however, the drawback of the color Moirée-effect complicates the digital signal acquisition.

In the described structures for forming such two-terminal or three-terminal components, the absorber layer of the individual diodes can be adjusted as a function of the color separation anticipated.

The hitherto known vertically integrated color detectors are based upon the requirement that the voltage applied across the detector is altered to obtain the complete color information. For this purpose at least three and usually more switching voltages are required.

OBJECT OF THE INVENTION

It is, therefore, the object of the invention to provide a multicolor sensor in thin-film technology whereby a sequential alteration of the voltage applied to the detector is not required to obtain the complete color information.

SUMMARY OF THE INVENTION

The objects are achieved, according to the invention in that a component is formed from a multiplicity of diode functions, preferably three, formed from layers, for example, pin-diode functions, nip-diode functions, npin-diode functions and/or pnip diode functions, which are arranged perpendicular to the light incidence direction and are connected with one another.

More particularly, the component according to the invention is based on amorphous silicon and its alloys, microcrystalline silicon and its alloys as well as two transparent conductive contact layers. The layer sequence according to the invention and the components according to the invention enable a simultaneous (parallel) readout of the photo current of the vertically-integrated diodes so that at one and the same place in an array arrangement characterized as a pixel a multiplicity of color signals can be detected simultaneously, for example, a complete red-blue-green (RGB) signal. The spectral sensitivity of this component can be adjusted from the near ultraviolet to the near infrared range by a suitable design of the individual diode functions by adjusting certain parameters like, for example, the respective layer thicknesses.

The invention is directed to the development of a component that permits a vertical color detection by a three-dimensional integration whereby the complete color information per pixel is readable in parallel. Since each upstream diode function in the light-incidence direction acts as an absorber for the diode functions lying therebelow, in an advantageous manner this renders the need for further optical filters superfluous.

For the realization of, for example, a four-terminal component according to the invention, the optical absorption of the individual diode must increase as increasing penetration depth and wavelength of the photons of the irradiating light. The detection concept is based on the fact that in the first diode, the shortest wave light, (e.g. blue light) and in the lowest diode, the longest wave light is absorbed; this applies independently of the selected layer structures of the individual diodes (e.g. whether the diode is of the nip, nipin, npin, pinip, pnip or pin type).

In considering npin- diode structures or pnip-diode structures, on both sides of a transparent contact layer is a respective doped semiconductor layer, especially a p-doped or n-doped layer. Thus via the conductive contact layer, which is preferably constituted as a TCO layer or from microcrystalline p-conducting or n-conducting material, only one charge-carrier type can be injected or collected since at the following p/n-heterotransition or n/p heterotransition, there is a charge-carrier reversal.

Because of the transition from a two-terminal to a four-terminal component, all three RGB signals are read out simultaneously rather than sequentially. The multiple sensor of the invention and the component according to the invention have the advantage that by vertical integration of the components with simultaneous detection of the signals to be picked up (for detection of, for example, the colors blue, green and red), the color Moireé effect is avoided (as is customary in use of a CCD camera by the provision of special color filters). In addition, in an advantageous manner with the aid of a so-called one-shot pickup, a complete signal can be obtained in the sense of color detection for digital image processing.

BRIEF DESCRIPTION OF THE DRAWING

The invention is described in greater detail hereinafter with reference to Figures and examples. In the drawing.

SPECIFIC DESCRIPTION

Figure 1:
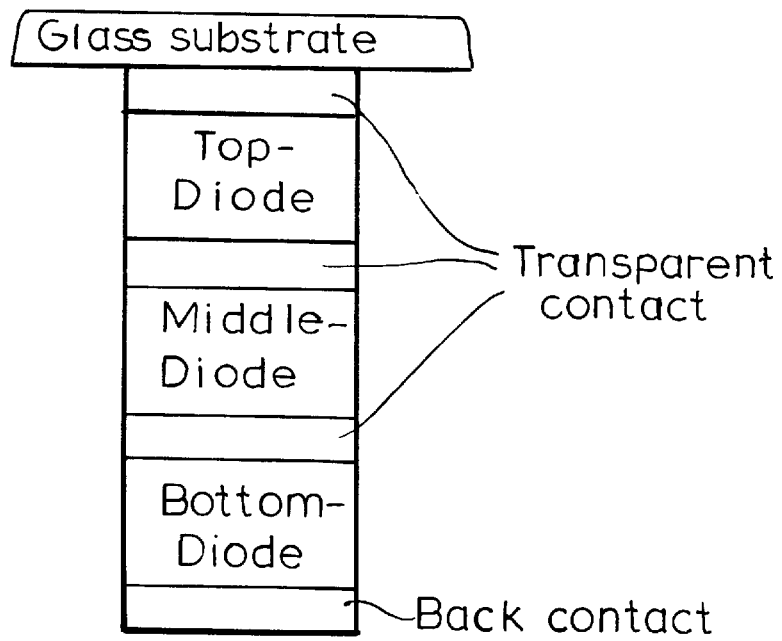
FIG. 1 is a schematic illustration of a vertically integrated color detector according to the invention of amorphous or microcrystalline silicon with three diode functions with which the basic colors blue, green and red are read out in parallel.

In FIG. 1 a schematic illustration of a vertically-integrated color detector from amorphous or microcrystalline silicon with three diodes has been shown whereby the color signals (blue, green, red) can be read out in parallel.

The schematically shown construction in FIG. 1 of the detector structure according to the invention is thereby comprised of three diodes for generating an RGB signal and which can be fabricated on a glass substrate.

On the transparent front contact, which, for example, is formed by means of a ZnO layer, SnO$_2$ layer or an ITO layer, a first detector structure (top diode) is deposited which absorbs blue light. Then follows the application of a further transparent contact (e.g. ZnO layer, SnO$_2$ layer or ITO layer) upon which a color-selective diode (middle diode) is also deposited. This diode detects green light. This arrangement is repeated for the third diode (bottom diode) which absorbs the long wavelength light of the spectrum (red).

Figure 2:
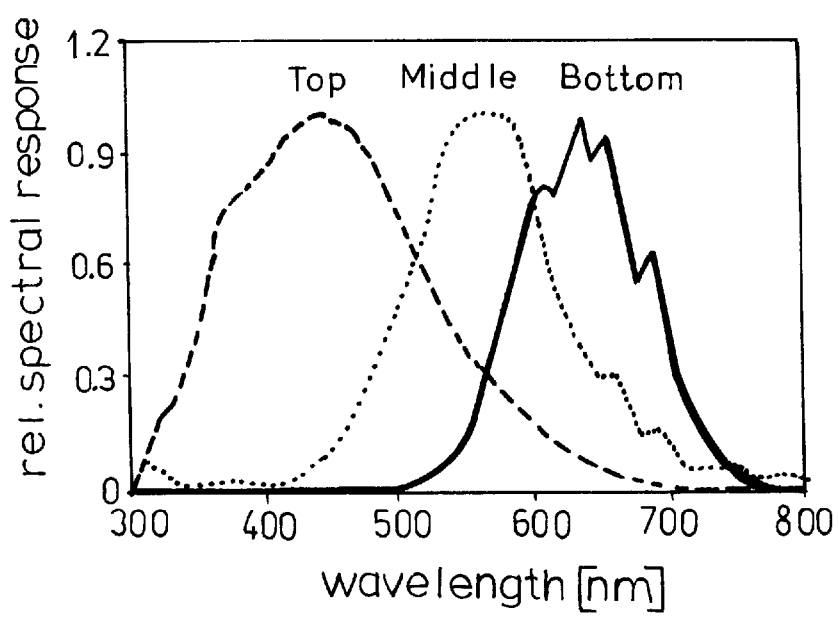
FIG. 2 is a graph of the spectral sensitivity of a four-terminal component according to the invention.

In FIG. 2 the spectral sensitivity of a 4-terminal component in a pin/nip/pin arrangement with a maximum spectral sensitivity of the top diode at 450 nm, of the middle diode at 565 nm and of the bottom diode at 640 nm, is shown.

For the case in which more than three diodes are to be realized, this process can be correspondingly repeated. The detector system is concluded with a back contact. The structuring of the multilayer structure can be effected, for example, by means of standard photolithography and reactive ion etching.

Thus individual diodes can be arranged from the light incident direction of the back contact in an optional combination of the individual diodes. For example, a 4-terminal element with, for example, the layer configuration nip/nip/nip, pin/pin/pin, pin/nip/pin, nip/pin/nip or another combination from pin/npin/npin/ or pin/npin/nip or the like can be realized.

The spectral sensitivity of the individual diodes can be matched to requirements by the use of materials of different band gaps, the use of a corresponding band gap design of the absorber layers (for example a u-shape, v-shape gradation of the energy gap within the absorber layer like, for example, a-Si$_x$Ge$_x$:H, hydrogen concentration or the use of a buffer, or a variation of the individual layer lengths of the active absorber layer as well as the nonactive contact layers (n-layers and p-layers).

Based upon the aforementioned optimization criteria, the absorber layers of the individual diodes can be so selected that the product of layer thickness and wavelength increases with increasing wavelength from the light incident direction to the back contact in the respective successive layers.

The optoelectronic characteristics of the layer sequences of the invention, the sensor or the component can be varied in accordance with the following features:

(a) Incorporation of germanium or carbon in the amorphous silicon network (a-SiGe:H, a-Si(C):H;

(b) Addition of hydrogen or variation of the hydrogen concentration in the process gas for both a-Si:H as well as for its alloys (point a);

(c) Incorporation of microcrystalline layers on a basis of silicon and germanium;

(d) Incorporation of layers with higher hydrogen dilution and lower deposition temperature (Ts=120–160° C.)

For the influence of the fabrication conditions on the transport characteristics of an a-Si:H based alloy in the framework of the invention, the following explanation is provided:

With amorphous silicon (a-Si:H), the optical electronic properties can be influenced by variation of the fabrication conditions. For example, the material quality can be altered by variation of the deposition pressure, the temperature, the supplied electrical power or the suitable admixture of additional process gases (like for example hydrogen, helium, argon or fluorine) in the layer deposition. This means that the charge-carrier transport characteristics (i.e. the product of charge-carrier life and charge-carrier mobility as well as the ambipolar diffusion length) can be adjusted in a targeted manner over a given range.

Figure 3:
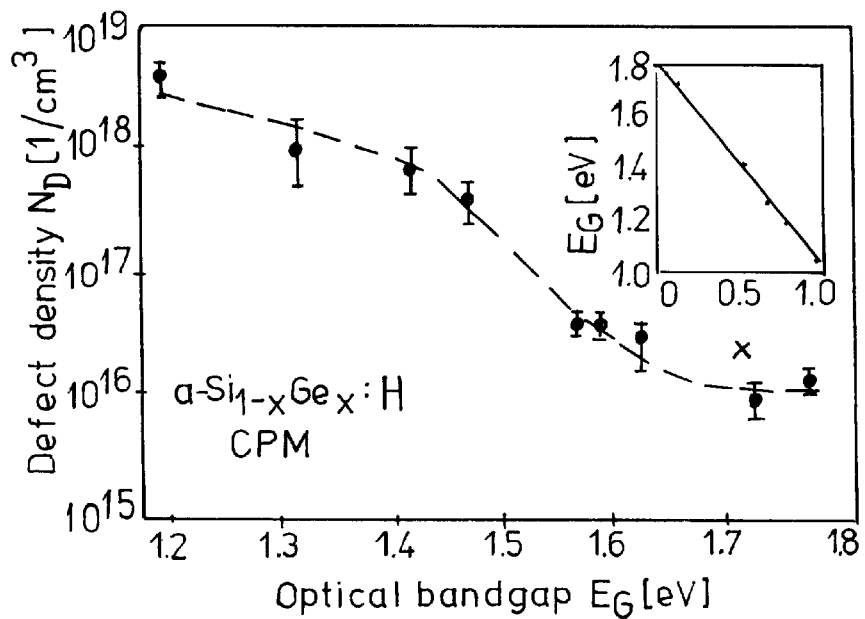
FIG. 3 is a graph of the defect density $N_D$ as a function of the optical band spacing for a-$Si_{1-x}Ge_x$:H (in the insert, the optical band spacing is shown as a function of the Ge content of the material)
Figure 4:
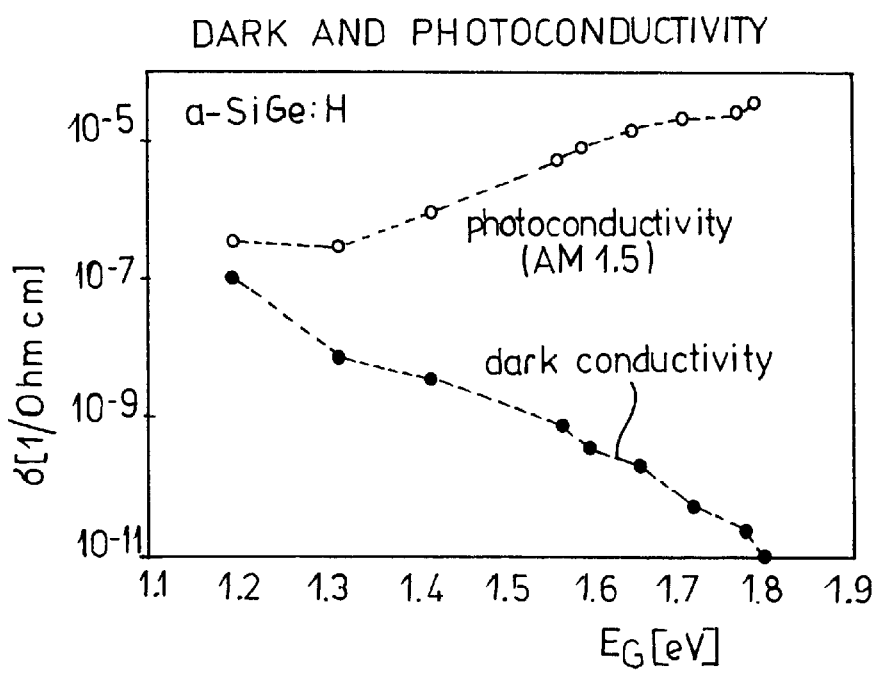
FIG. 4 is a graph of the photo conductivity (AM 1.5) and the darkness conductivity as a function of the optical spacing for a-Si$_{1-x}$Ge$_x$:H.
Figure 5:
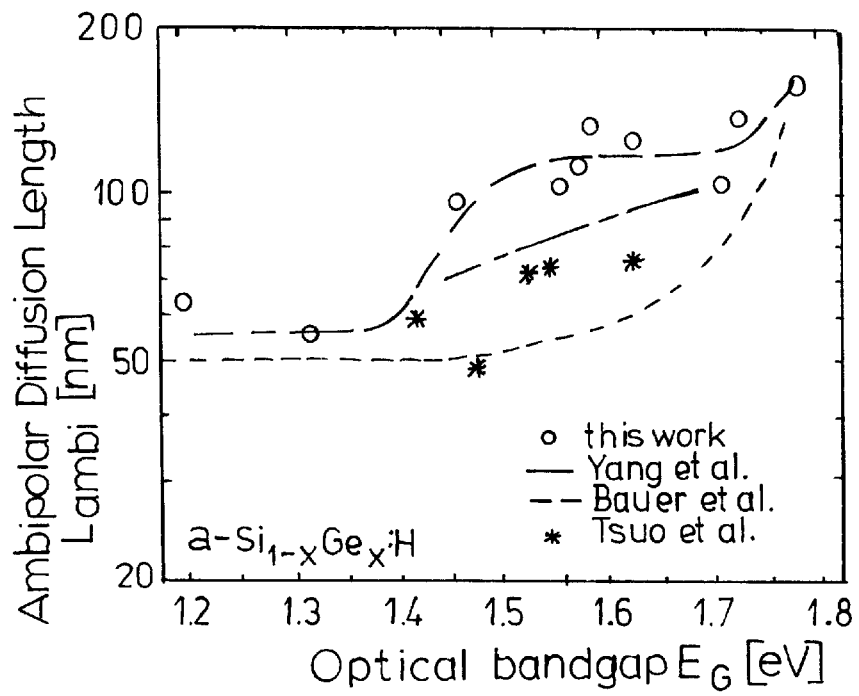
FIG. 5 is the ambipolar diffusion length L$_{ambi}$ as a function of the optical band spacing for a-Si$_{1-x}$Ge$_x$:H, for comparison with values from the literature [3, 4, 5]

With the alloying of the amorphous silicon, like for example, the silicon-germanium (a-Si$_{1-x}$Ge$_x$:H) and silicon-carbon alloys (a-Si$_{1-x}$C$_x$:H), the transport characteristics change in part very strongly with the composition of the respective alloy. This condition is illustrated in the example of the silicon-germanium alloy in FIGS. 3–5. With increasing germanium content, the optical band spacing can be adjusted continuously (see the increasing germanium content), the optical band spacing can be adjusted continuously (see the insert of FIG. 3) between E$_G$≈1.8 eV (a-Si:H) and E$_G$≈1.0 eV (a-Ge:H). With increasing Ge concentration, the defect density, determined by "Constant Photocurrent Method", measuring technique, increases up to two orders of magnitude (FIG. 3, large illustration. Simultaneously, the photoconductivity and the dark conductivity vary (see FIG. 4) as does the ambipolar diffusion length (see FIG. 5) in dependence upon the light composition.

The photoconductivity is proportional to the product of charge-carrier life τ and mobility μ and mirrors the transport characteristics of the majority charge carrier (here: electrons). The ambipolar diffusion length describes for the material under consideration substantially the transport characteristics of the minority charge carrier (here: holes).

Figure 6:
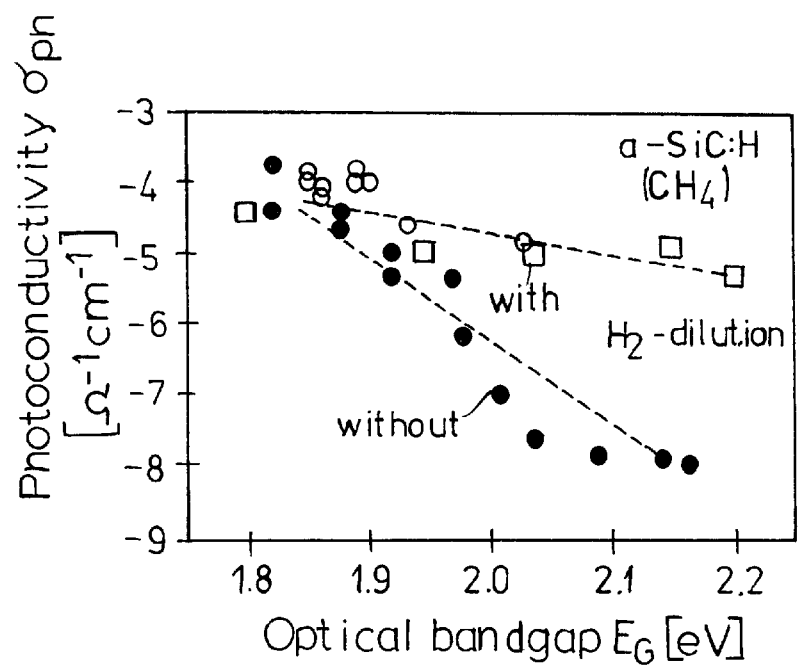
FIG. 6 is a graph of the photoconductivity as a function of the optical band gap for a-SiC:H, made from a silane/methane mixture with and without hydrogen dilution (circles from literature reference [6] and squares from literature reference [2])

The transport characteristics can also be influenced (as with a-Si:H) by a silicon alloying by preparative processes, especially by the addition of additional process gases during deposition. As an example there is shown in FIG. 6 for the alloyed system a-Si$_{1-x}$C$_x$:H, the influence of hydrogen addition ("hydrogen dilution") to the process gasses silicon (SiH$_4$) and methane (CH$_4$). With material made with increasing hydrogen dilution, there is a substantially greater photoconductivity and thus higher values for the $\mu\tau$ product than material deposited without $H_2$ addition. This effect increases in increasing carbon content in the material strongly under the ratio $[H_2]/([SiH_4]+[CH_4])$ can thus take on values of 10 to 50.

A further possibility in the framework of the invention to produce materials with larger band gaps and good optoelectronic characteristics lies in the use of higher hydrogen dilutions (preferably 4 to 30 times) and a low deposition temperature (preferably a temperature in the range of 120° C. to 160° C.) Under these deposition conditions, an energy gap in the framework of the invention in the range between 1.8 eV and 1.95 eV can be adjusted.

Through the use of microcrystalline contact layers (n- and p-layers), optionally partly or completely, the TCO layers between the individual diodes (e.g. pin/TCO/pin/TCO/pin) can be avoided, since they have a significant conductivity and on the other hand a significantly longer etching rate (e.g. with respect to ion etching) than a-Si:H layers.

Figure 7:
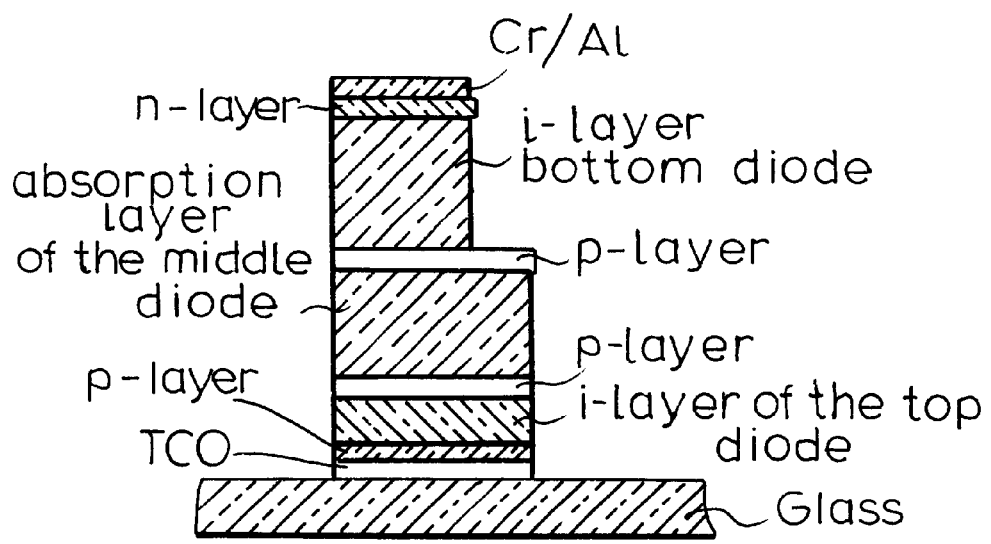
FIG. 7 is a schematic structure diagram of a four-terminal component on the basis of a pi-nipin-structure with microcrystal-line contact layers.

Such an arrangement according to the invention, as has been shown in FIG. 7 as a pinipin structure with microcrystalline contact layers, leads also to a possible contacting of the individual diodes. As can be deduced from FIG. 7, the inner-lying p-layer is partly liberated by appropriate structuring to form the inner-lying contact and enable contacting based upon the different selectivities of microcrystalline and amorphous silicon during the etching process, the thin-film component can be structured and thus realized. This structure affords the advantage, over the arrangement proposed in FIG. 1, that TCO layers can be omitted and thus the number of doped layers reduced. This enables a simplification of the construction to be achieved. More expensive multiterminal structures with complex layer sequences, like for example nipin diodes or pinip diodes embedded between the transparent contacts indeed enable the detection of independent linear structural courses which are required for further processing, but the component cannot be read out in parallel as is the case when one provides n > three diodes and utilizes the adjustable spectral sensitivity of a diode in an application-specific manner. Depending upon the respective uses, the spectral sensitivities can be correspondingly set. During a read-out cycle, however, it must be ensured that one can read out an RGB signal without alteration of the voltage applied to the detector.

As an example, it is proposed that the middle diode of a four-terminal component be formed as a pinip structure. This structure can, depending upon use, have a positive or negative potential applied thereto. The advantage of parallel readout does not depend thereon. Such a structure affords, apart from adjustable green sensitivity, a further optimization possibility. By the additionally introduced layers, there is a greater degree of freedom of the design of the structure so that the spectral sensitivity can be matched more closely to a standard RGB signal. This possibility lies in the range of the optical matching and coupling two for four certain spectral ranges of the incident light.

Alternatively to a detector structure in accordance with the invention, which is deposited on a glass substrate with a conductive transparent front contact, the multilayer system can be deposited in an inverted manner as a multilayer system on different. substrates (e.g. Ag, Al, or a silicon wafer which, for example, contains the readout electronic circuitry).

Figure 8A:
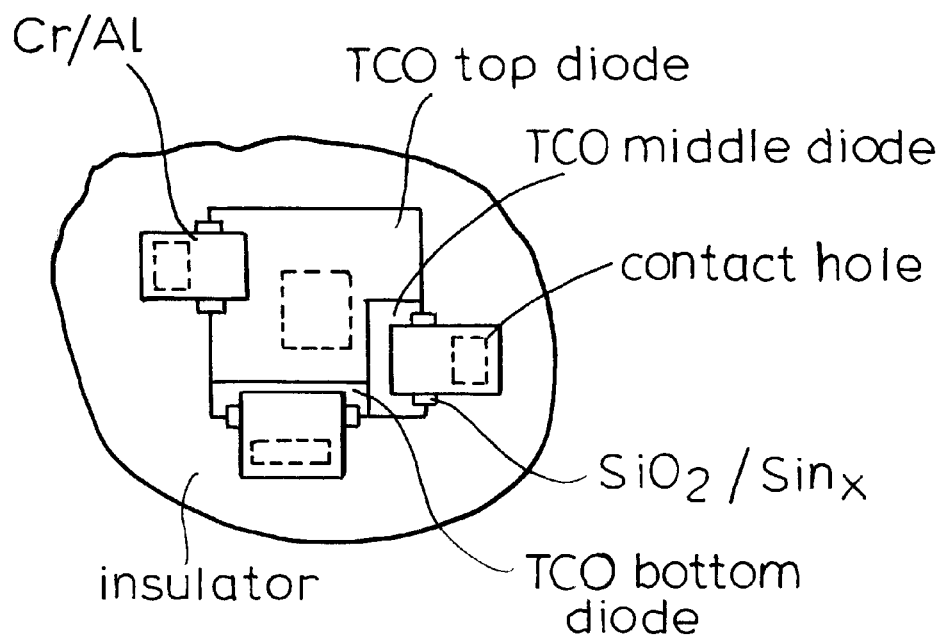
FIG. 8a is a plan view of a schematic structure of a detector structure formed in an inverted manner of a four-terminal component.
Figure 8B:
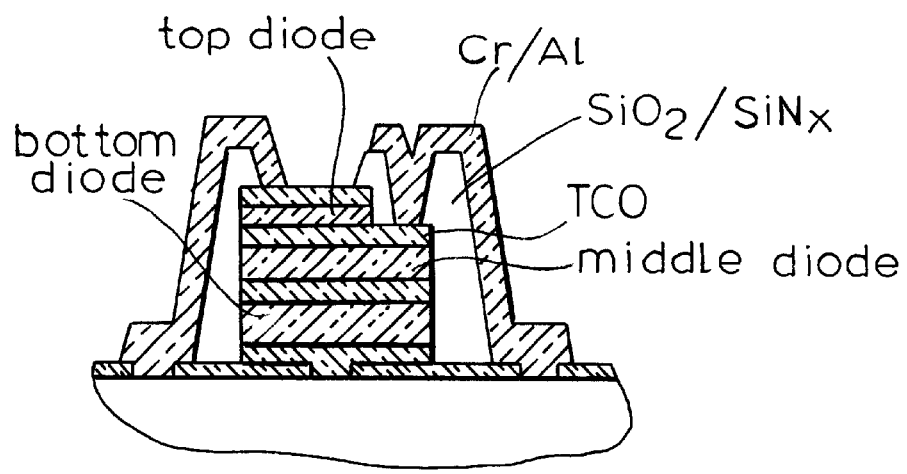
FIG. 8b is a section through a schematically illustrated construction of a detector structure configured in an inverted fashion of a four-terminal component.
Figure 9:
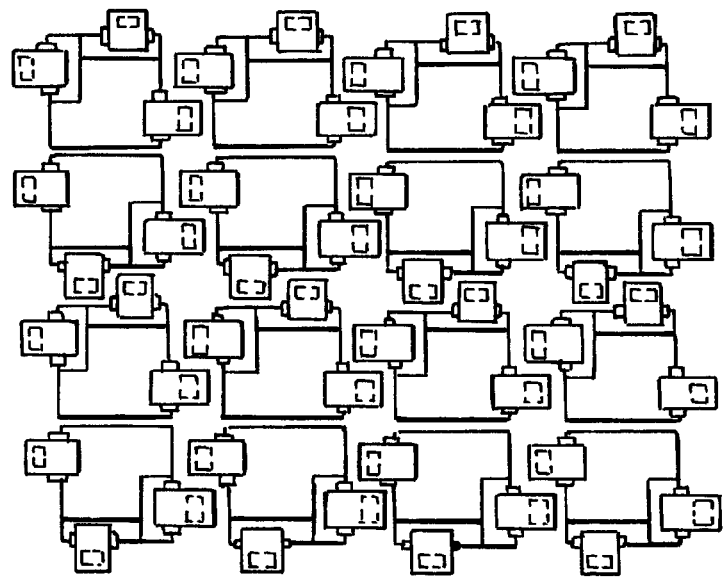
FIG. 9 is a schematic illustration of a 2D-array according to the invention with the aid of respective four-terminal components as deducible from FIGS. 8a, 8b for simultaneous generation of an RGB signal.

FIG. 8 shows a possible schematic construction of a detector structure manufactured in an inverted way in plan view (FIG. 8a) and a section through the multilayer structure (FIG. 8b). For example, on an electronic circuit on the basis of crystalline silicon, which is separated by a structured insulator from the thins film detector system, the detector system can be deposited. After the structuring of the amorphous or microcrystalline layer system, a further insulation layer ($SiO_2$, $SiN_x$ or polyamide) is applied in a PECVD process and also structured. The realization of the contact between the individual detector and the readout electronics is effected by means of a metallization (e.g. Ag) which is structured in a liftoff process. Aside from the realization of the individual detector, a row sensor or a 2-dimensional array can be realized with these components. The possible realization of a 2D array is schematically illustrated in FIG. 9.

Literature

[3] W. Luft, Y. S. Tsuo in: *Hydrogenated Amorphous Silicon Alloy Deposition Processes*, Marcel Dekker Inc., New York, Basel, Hong Kong, (1993 ).

[4] G. H. Bauer, C. E. Nebel and H.-D. Mohring, Mat. Res. Soc. Symp. Proc. 118, 679 (1988).

[5] L. Yang, L. Chen, A. Catalano, Mat. Res. Soc. Symp. Proc. 219, 259 (1991).

[6] J. Fölsch, Dissertation, Universitat Stuttgart 1995, in: Berichte des Forschungszentrums Jülich, Jül-3147 (1995).

What is claimed is:

1. A multicolor sensor comprising:
   a transparent first conductive layer at a light-incidence side of a stack;
   first layer sequence adjacent said first conductive layer and following said first conductive layer in a direction of travel of light through said stack, said first layer sequence forming part of said stack and constituting a first diode function absorptive to a low wavelength in said light;
   a transparent second conductive layer adjacent said first, layer sequence;
   a second layer sequence adjacent said second conductive layer and following said second conductive layer in said direction of travel, said second layer sequence forming part of said stack and constituting a second diode function absorptive to an intermediate wavelength in said light greater than said low wavelength;
   a transparent third conductive layer adjacent said second layer sequence;
   a third layer sequence adjacent said third conductive layer and following said third conductive layer in said direction of travel, said third layer sequence forming part of said stack and constituting a third diode function absorptive to a wavelength in said light greater than said intermediate wavelength; and
   a fourth conductive layer adjacent said third layer sequence whereby a three-color signal is obtainable simultaneously from said conductive layers.

2. The multicolor sensor defined in claim 1 wherein said first layer sequence absorbs blue light, said second layer sequence absorbs green light and said third layer sequence absorbs red light.

3. The multicolor sensor defined in claim 2 wherein said layer sequences are selected from pin, nip, npin and pnip layer sequences with at least one of said layer sequences being an npin or pnip layer sequence.

4. The multicolor sensor defined in claim 3 wherein one of the n and p layers of the adjoining np and pn layer pairs of the npin or pnip layer sequence is a microcrystalline layer.

5. A two-dimensional array of multicolor sensors each of said multicolor sensors comprising:
- a transparent first conductive layer at a light-incidence side of a stack;
- a first layer sequence adjacent said first conductive layer and following said first conductive layer in a direction of travel of light through said stack, said first layer sequence forming part of said stack and constituting a first diode function absorptive to a low wavelength in said light;
- a transparent second conductive layer adjacent said first layer sequence;
- a second layer sequence adjacent said second conductive layer and following said second conductive layer in said direction of travel, said second layer sequence forming part of said stack and constituting a second diode function absorptive to an intermediate wavelength in said light greater than said low wavelength;
- a transparent third conductive layer adjacent said second layer sequence;
- a third layer sequence adjacent said third conductive layer and following said third conductive layer in said direction of travel, said third layer sequence forming part of said stack and constituting a third diode function absorptive to a wavelength in said light greater than said intermediate wavelength; and
- a fourth conductive layer adjacent said third layer sequence whereby a three-color signal is obtainable simultaneously from said conductive layers.

6. A CCD-containing video camera having a two-dimensional array of multicolor sensors, each of said multicolor sensors comprising:
- a transparent first conductive layer at a light-incidence side of a stack;
- a first layer sequence adjacent said first conductive layer and following said first conductive layer in a direction of travel of light through said stack, said first layer sequence forming part of said stack and constituting a first diode function absorptive to a low wavelength in said light;
- a transparent second conductive layer adjacent said first layer sequence;
- a second layer sequence adjacent said second conductive layer and following said second conductive layer in said direction of travel, said second layer sequence forming part of said stack and constituting a second diode function absorptive to an intermediate wavelength in said light greater than said low wavelength;
- a transparent third conductive layer adjacent said second layer sequence;
- a third layer sequence adjacent said third conductive layer and following said third conductive layer in said direction of travel, said third layer sequence forming part of said stack and constituting a third diode function absorptive to a wavelength in said light greater than said intermediate wavelength; and
- a fourth conductive layer adjacent said third layer sequence whereby a three-color signal is obtainable simultaneously from said conductive layers.

\* \* \* \* \*